United States Patent
Preti et al.

(10) Patent No.: US 7,314,526 B1
(45) Date of Patent: Jan. 1, 2008

(54) REACTION CHAMBER FOR AN EPITAXIAL REACTOR

(75) Inventors: Franco Preti, Milan (IT); Vincenzo Ogliari, Capergnanica (IT); Giuseppe Tarenzi, Castiglione D'Adda (IT)

(73) Assignee: LPE S.p.A., Milan (IT)

( * ) Notice: Subject to any disclaimer, the term of this patent is extended or adjusted under 35 U.S.C. 154(b) by 0 days.

(21) Appl. No.: 09/807,589

(22) PCT Filed: Mar. 17, 2000

(86) PCT No.: PCT/EP00/02364

§ 371 (c)(1),
(2), (4) Date: Apr. 12, 2001

(87) PCT Pub. No.: WO00/58533

PCT Pub. Date: Oct. 5, 2000

(30) Foreign Application Priority Data

Mar. 25, 1999 (IT) .............................. MI99A0607

(51) Int. Cl.
*C23C 16/44* (2006.01)
*C23C 16/458* (2006.01)
*C23C 16/455* (2006.01)
*H01L 21/306* (2006.01)
*C23F 1/00* (2006.01)
*C23C 16/24* (2006.01)

(52) U.S. Cl. .................. 118/715; 118/730; 118/728; 156/345.33; 156/345.34; 156/345.55

(58) Field of Classification Search .............. 118/715, 118/728, 50; 156/345.33
See application file for complete search history.

(56) References Cited

U.S. PATENT DOCUMENTS

| | | | | |
|---|---|---|---|---|
| 3,525,870 A | * | 8/1970 | Mee et al. ................... | 250/568 |
| 3,603,284 A | * | 9/1971 | Garnache .................... | 118/725 |
| 3,865,072 A | * | 2/1975 | Kirkman ..................... | 118/663 |
| 4,322,592 A | * | 3/1982 | Martin ........................ | 219/634 |
| 4,421,786 A | * | 12/1983 | Mahajan et al. ............ | 117/101 |
| 4,579,080 A | * | 4/1986 | Martin et al. ............... | 118/500 |
| 4,632,060 A | * | 12/1986 | Goto et al. ................. | 118/730 |
| 4,638,762 A | * | 1/1987 | Kim et al. .................. | 118/725 |
| 4,694,779 A | * | 9/1987 | Hammond et al. ......... | 118/730 |
| 4,747,367 A | * | 5/1988 | Posa .......................... | 118/715 |

(Continued)

FOREIGN PATENT DOCUMENTS

DE 38 38 164 A1 5/1989

(Continued)

OTHER PUBLICATIONS

Improving Resistivity and Thickness Uniformity of Epitaxial Deposits, IBM Technical Disclosure Bulletin, L.M. Elijah, vol. 13, No. 12, May 1971.

*Primary Examiner*—Rudy Zervigon
(74) *Attorney, Agent, or Firm*—Katten Muchin Rosenman LLP (57) ABSTRACT

Reaction chamer (10) for an epitaxial reactor comprising a belljar (14) made of insulating, transparent and chemically resistant material, a susceptor (24) provided with disk-shaped cavities (34*a-n*) for receiving wafers (36*a-n*) of material to be treated and having an insulating and chemically resistant plate (40) arranged above it, and a diffuser (54) consisting of a plurality of outlet pipes (106*a-f*) mounted on a cap (52) fixed to an upper opening (50) of the belljar (14).

19 Claims, 4 Drawing Sheets

U.S. PATENT DOCUMENTS

| | | | |
|---|---|---|---|
| 4,761,269 A * | 8/1988 | Conger et al. | 118/679 |
| 4,807,562 A * | 2/1989 | Sandys | 118/725 |
| 4,911,102 A * | 3/1990 | Manabe et al. | 118/719 |
| 4,928,626 A * | 5/1990 | Carlson et al. | 117/86 |
| 4,961,399 A * | 10/1990 | Frijlink | 118/730 |
| 5,038,711 A * | 8/1991 | Dan et al. | 118/715 |
| 5,264,040 A * | 11/1993 | Geyling | 118/728 |
| 5,304,247 A * | 4/1994 | Kondo et al. | 118/715 |
| 5,453,124 A * | 9/1995 | Moslehi et al. | 118/715 |
| 5,595,606 A * | 1/1997 | Fujikawa et al. | 118/725 |
| 5,681,418 A * | 10/1997 | Ishimaru | 156/345.37 |
| 5,846,883 A * | 12/1998 | Moslehi | 438/711 |
| 5,888,907 A * | 3/1999 | Tomoyasu et al. | 438/714 |
| 5,900,297 A * | 5/1999 | Rudolph et al. | 428/66.2 |
| 5,908,504 A * | 6/1999 | Hanley | 117/86 |
| 5,910,221 A * | 6/1999 | Wu | 118/723 R |
| 5,964,948 A * | 10/1999 | Dietze et al. | 118/715 |
| 6,015,595 A * | 1/2000 | Felts | 427/446 |
| 6,080,241 A * | 6/2000 | Li et al. | 118/715 |
| 6,125,788 A * | 10/2000 | Hills et al. | 156/345.51 |
| 6,203,620 B1* | 3/2001 | Moslehi | 118/723 R |
| 6,475,284 B1* | 11/2002 | Moore et al. | 118/715 |
| 6,539,890 B1* | 4/2003 | Felts | 118/723 R |
| 6,562,128 B1* | 5/2003 | Dietze et al. | 117/97 |

FOREIGN PATENT DOCUMENTS

| | | |
|---|---|---|
| EP | 0 293 021 A2 | 11/1988 |
| EP | 0 305 195 A2 | 3/1989 |
| EP | 0415191 A1 * | 8/1990 |
| EP | 0 415 191 A1 | 3/1991 |

* cited by examiner

REACTION CHAMBER FOR AN EPITAXIAL REACTOR

The present invention relates to an improvement to the reaction chamber of an epitaxial reactor performing deposition, by means of chemical vapour reaction, onto substrates of crystallized material. In particular, the present invention relates to an improved reaction chamber for an epitaxial reactor performing the deposition of semiconductor materials onto monocrystalline substrates made of the same materials and, more particularly, relates to the epitaxial growth by means of deposition of semiconductor silicon onto substrates of the same material.

The art involving the epitaxial growth of monocrystals on substrates consisting of the same material has been known for decades and is widely used for the preparation of electronic semiconductor devices and, in particular, for the preparation of silicon substrates or "wafers" to be used in the manufacture of integrated circuit chips.

For this silicon epitaxial growth, extensive use is made of chemical vapour deposition (CVD) obtained by means of the pyrolysis of gaseous compounds of silicon, called silicon source gases, such as silane ($SiH_4$), monochlorosilane ($SiH_3Cl$), dichlorosilane ($SiH_2Cl_2$), trichlorosilane ($SiHCl_3$) and silicon tetrachloride ($SiCl_4$) in a hydrogen atmosphere. In order to achieve this pyrolysis, epitaxial reactors are used, said reactors being essentially formed by a belljar made of insulating and transparent material enclosing a support and a heater for silicon wafers, consisting of a susceptor made of graphite lined with silicon carbide and provided with substantially disk-shaped cavities receiving the silicon wafers and heated by means of the induction of currents therein by a coil externally embracing the quartz belljar. The susceptors may have various shapes, for example may be disk-shaped or in the form of a truncated pyramid, and here reference will be made to susceptors in the form of a truncated pyramid.

Reactors having a susceptor in the form of a truncated pyramid inside a quartz belljar have been known for a long time, as disclosed, for example, by Italian Patent No. 1,215,444 and by the corresponding European Patent No. 293,021.

In these types of reactors it was known that the speed of deposition of the silicon onto a substrate, also made of silicon, more or less depended directly, all other conditions being equal, on the speed of flow of the abovementioned silicon source gases over the surfaces of the substrates kept at temperatures inducing pyrolysis of the said gases so as to form silicon deposits. As was commented in Italian Patent No. 1,231,547 and in the corresponding published application of European Patent No. 0,415,191 in the name of the owner of the present application, a truncated-pyramid susceptor enclosed in a cylindrical belljar having a hemispherical dome mounted above it produced flow speeds for silicon source gases which were minimal in the centre of the side faces of the susceptor, where the distance between the side faces and the neighbouring cylindrical belljar wall was greatest, and maximal close to corners separating adjacent faces of the susceptor, where the distance between said faces and said belljar wall was smallest. In order to overcome the corresponding variations in deposition speed and consequent variations in deposition thicknesses, in the abovementioned Italian Patent No. 1,231,547 it was thought to provide the corners of the susceptor with projections towards the belljar wall which would reduce to zero, or close to zero, the flow speeds of said gases in the vicinity of these projections and would render more or less uniform the speed across each face of the susceptor between said projections and the belljar wall. The projections formed for this purpose are shown in the abovementioned patent in FIGS. 8 to 19 which illustrate projections both inserted into the corners of the susceptor, as shown in FIGS. 8 to 9B, and formed from the same material of the susceptor, as shown in FIGS. 11 to 19. This system operated in a fairly satisfactory manner, although a certain degree of irregularity and unpredictability was noted with regard to operation when for the purposes of cleaning or in order to repair serious faults, a belljar had to be replaced by a new one, even though it appeared to be practically identical to the one replaced. What is more, since the present tendency is to manufacture increasingly larger silicon wafers with a diameter of between about 100 mm (4") and 200 mm (8"), it was noted that these irregularities following replacement of the belljar were accentuated as increasingly larger silicon wafers were manufactured.

In this connection, it is already known that, when the diameter of the wafers is increased, the qualitative requirements of the epitaxial wafers become increasingly stringent and, therefore, a reactor which simultaneously processes a large number of wafers (batch type reactor) must strike an acceptable balance between quantity and quality of the wafers produced (low cost).

A qualitative parameter of particular importance is the uniformity of thickness of the epitaxial layer deposited. In this connection, in an epitaxial reactor, in particular of the batch type, the uniformity of thickness is influenced by certain factors:

difference in thickness between different points on each individual wafer;

difference between individual wafers within the same batch;

difference between various batches.

As can be seen from the abovementioned prior art documentation, the reaction chamber of a typical epitaxial reactor with a truncated-pyramid susceptor, known as a barrel epitaxial reactor, is essentially composed of the following parts:

a cylinder-shaped belljar provided at the top with a flange connected to a belljar closing dome by a narrow cylindrical neck;

a gas diffuser, to be used in the chemical vapour deposition reactions, consisting of an inlet pipe connected to two parallel plates having the function of distributing the outgoing gas flow in a uniform manner;

a quartz plate to be rested on the cover of the susceptor; and a susceptor provided with its supports.

The components listed above together form the essential part of a reaction chamber.

It is known that the susceptors of reactors may receive numbers of wafers, depending on the diameter thereof, for example in accordance with the following table:

| Wafer diameter | No. of wafers | Wafer arrangement |
| --- | --- | --- |
| 100 mm (4") | 30 | Three rings divided into ten columns |
| 125 mm (5") | 24 | Three rings divided into eight columns |
| 150 mm (6") | 14 | Two rings divided into seven columns |
| 200 mm (8") | 5 | One ring divided into five columns |

In general, the greater the number of rings, the smaller the number of columns and the greater the difficulty in achieving an acceptable balance in the uniformity of thickness of the epitaxial layers. The uniformity of thickness tends to vary greatly between rings, i.e. in a vertical direction, owing to the truncated-pyramid shape of the susceptor enclosed inside a substantially cylindrical belljar.

The reaction chamber, provided in accordance with the teachings of the abovementioned prior art, produces satisfactory results when all of its components are manufactured to the design specification. If, however, a component is not made to specification, serious drawbacks may arise. In general, neither the susceptor nor the quartz plate cause problems, unless there has been a major deviation. On the other hand, the belljar and the distributor are extremely critical and their critical nature increases with the production of wafers which have an increasingly larger diameter. This has resulted in the need for increasingly smaller tolerances which, at a certain point, become impossible to comply with, such that when a belljar or a diffuser—even when manufactured to the same design specification—is replaced, the results in terms of uniformity of thickness of the deposited layer vary greatly, in a positive or negative sense.

Studies and tests carried out in this connection have shown that:
a) the diffuser is extremely critical because the speed of the gas at the inlet pipe is very high (about 130 m/sec), while it is considerably lower at the outlet (about 3 m/sec); therefore, minimum deviations in terms of shape or minor differences between individual parts result in substantial deviations in terms of performance;
b) the shape of the so-called "shoulder" of the belljar, i.e. the dome-shaped zone which connects the cylindrical side wall of the belljar to the neck ending in the upper flange, to which a support plate connected to the diffuser is sealingly fixed, is extremely critical because the quartz plate resting on the susceptor is situated very close to the curved wall of the said shoulder such that convective pockets are formed in the gas flow, said pockets having widely varying forms depending on the radius of curvature of said shoulder (minimum variations in this radius produce major variations in these convective pockets) and depending on the irregularities of the internal surface formed using manual glass-processing techniques. A belljar provided with a badly made dome usually results in poor results in terms of vertical uniformity, i.e. in substantial differences between one ring and the next;
c) the internal diameter of the belljar is extremely critical: if the belljar is too narrow, the uniformity on each individual wafer tends to be poor.

The abovementioned drawbacks are overcome by the present invention in which:
a diffuser with parallel discs supplied by a central pipe according to the prior art, supported by a cap fixed to the upper flange, is replaced by a new diffuser formed by a cap supplied by a central dome-piece and connected to a symmetrical annular distribution chamber having a plurality of pipes of the same length which connects the said annular chamber of the cap to a dome zone of the belljar situated just underneath the neck connecting the upper flange to the dome, said plurality of pipes ensuring a uniform distribution of flow at a lower speed;
the cylindrical zone of the belljar above the quartz plate supported above the susceptor is extended so as to eliminate any interference between plate and shoulder;
a minimum internal diameter of the belljar is fixed so as to keep the belljar as far away as possible from the susceptor; and
the corners of the susceptor, in the upper zone thereof, are provided with projecting baffles inserted into recesses formed in the body of the said susceptor, said baffles having a length about half that of the corners of the susceptor.

The characteristic features of the present invention will be defined in the claims forming the conclusive part of the present description. However, other features and advantages of the same invention will emerge more clearly from the following detailed description of an example of embodiment thereof provided solely by way of a non-limiting illustration, and in conjunction with the accompanying drawings in which:

With reference to the figures, it can be seen that a reaction chamber 10 of an epitaxial reactor is formed by a base 12 supporting a belljar 14 made of insulating and transparent material, such as quartz, non-reactive to the chemical reagents to be introduced into the belljar 14, and surrounded by an induction coil 16 of the reflective type, such as that illustrated in the abovementioned Italian Patent No. 1,215, 444 and in the corresponding European Patent No. 293,021. Obviously, the coil 16 rests on a support 18 containing vanes 20 for distributing the air currents 22 which flow into a cavity between the belljar 14 and coil 16, performing cooling thereof.

The belljar 14 has, positioned inside it, a susceptor 24 in the form of a truncated pyramid, resting on a supporting and rotating shaft 26 and essentially formed by a lateral shell 28 made of electrically conductive material, such as graphite, and lined with a thin layer of chemically inert material, such as silicon carbide (SiC), closed at the bottom by a first flat plate 30 and at the top by a second flat plate 32. The said flat plates 30 and 32 may be made of materials which are both insulating and inert, such as quartz or ceramic material, as well as conductive, such as graphite, provided that they are lined within inert material, such as silicon carbide. Graphite is particularly preferred because it is very easy to machine (hardness factor 2 on the Moss scale) and may be easily lined with silicon carbide using methods which have been known for a long time to skilled people in this art. The lateral shell 28 of the susceptor 24 is provided with disk-shaped cavities 34a-n able to receive wafers 36a-n of semiconductor silicon to be treated using the methods required in order to prepare semiconductor chips for integrated circuits.

The susceptor 24 has, projecting above it, a column 38 supporting a plate 40, which are both made of inert material, such as quartz or ceramic material, the plate 40 having the obvious function of preventing silicon source gases directly striking the susceptor 24.

According to the present invention, the belljar 14, instead of terminating in the usual hemispherical dome of the prior art, terminates in a shoulder 42 which is raised with respect to the susceptor 24 and the plate 40 so that the space between the belljar 14 and the plate 40 is substantially unrestricted, thereby avoiding any interference between the plate 40 and shoulder 42.

Figure 3:
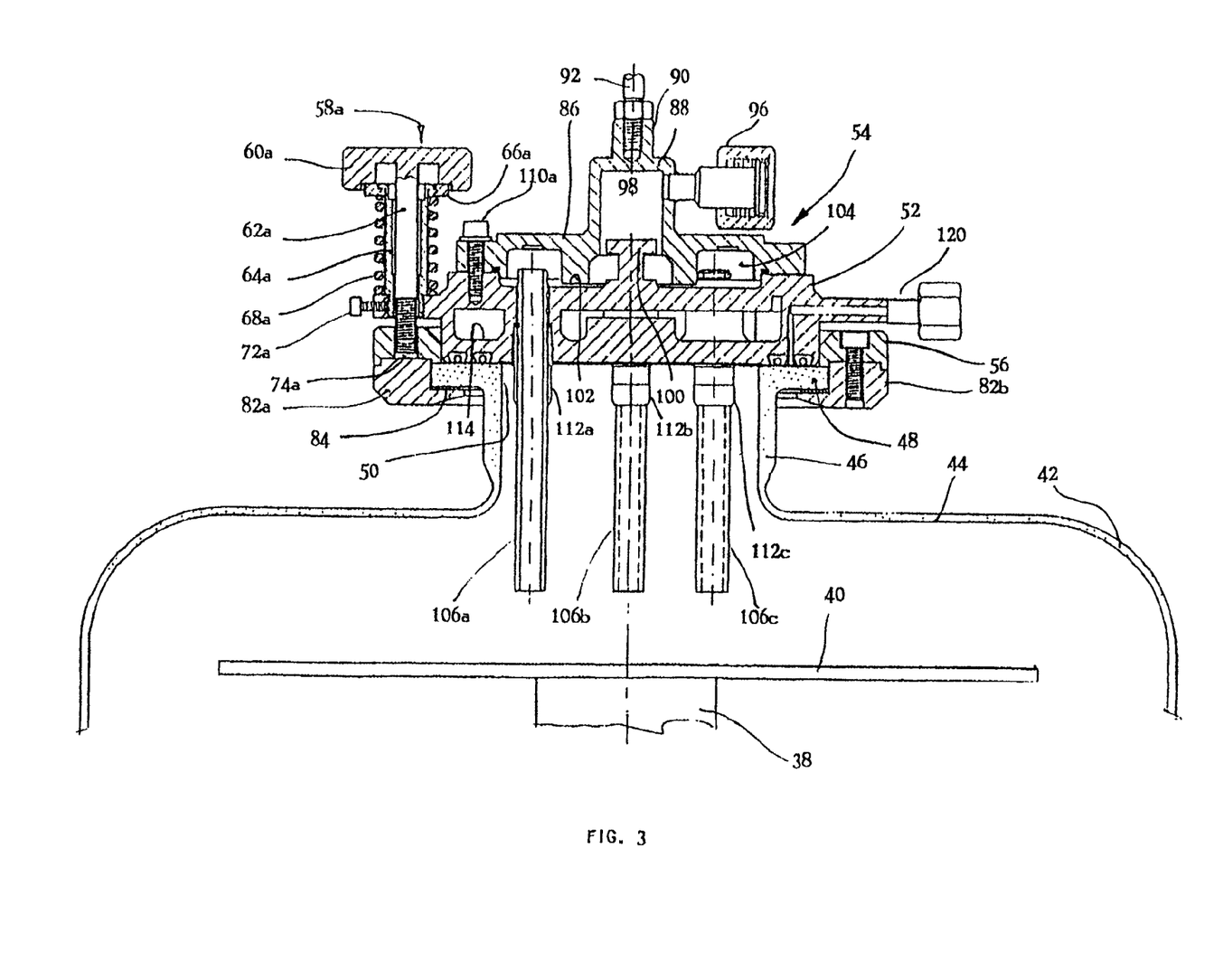
FIG. 3 is a partial enlarged view of the cap and distributor assembly for the reaction chamber according to the invention.
Figure 4:
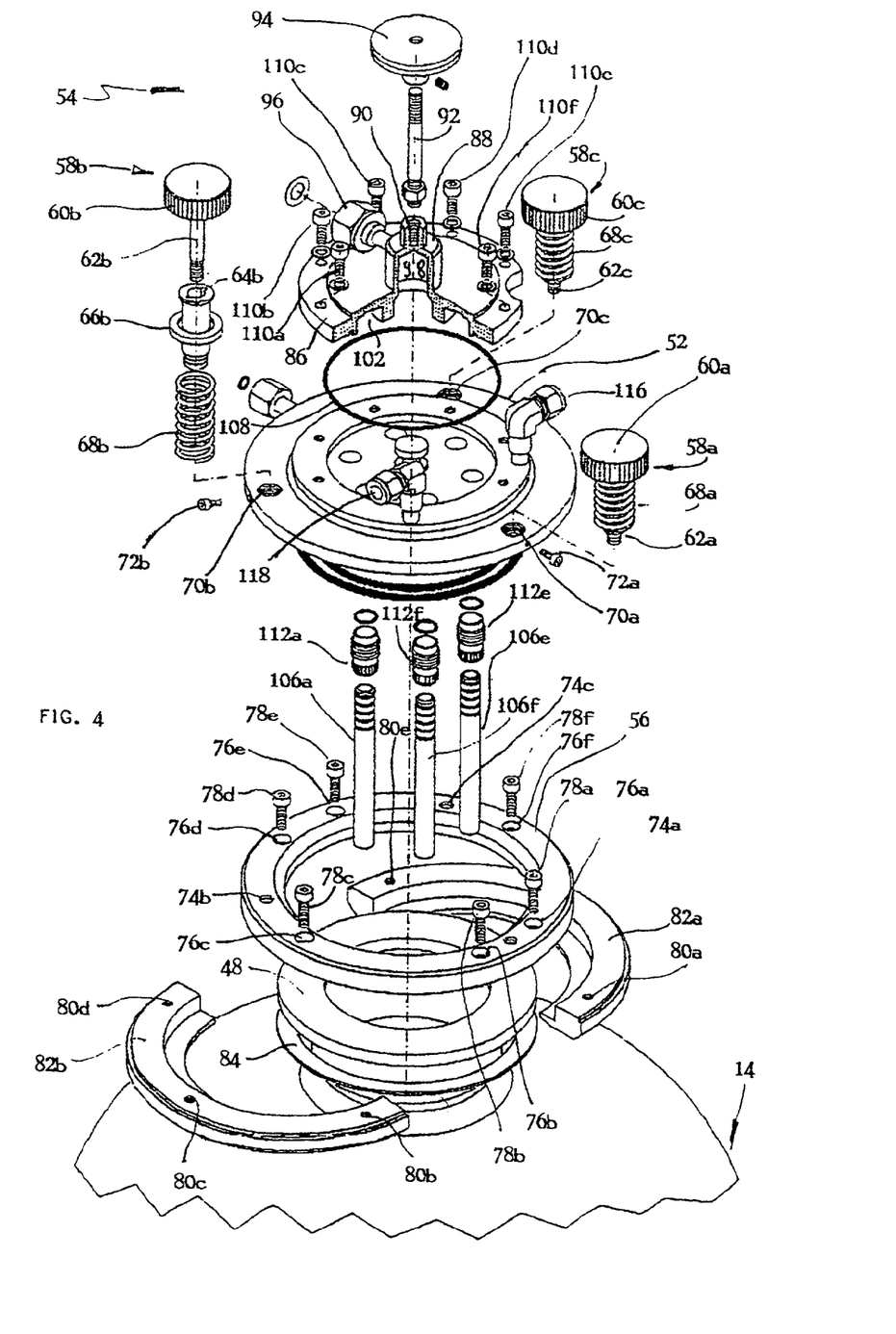
FIG. 4 is an exploded perspective view of the same cap and distributor assembly, showing all of its components.

After the shoulder 42, the belljar wall continues with a flat zone 44 connected to a raised central neck 46 terminating in a thickened flange 48 which defines an opening 50 designed to receive a cap 52 of a diffuser 54 according to the invention, illustrated in greater detail in FIGS. 3 and 4.

The diffuser 54 consists of a hollow cap 52 connected to an annular flange 56 by means of spring-loaded tie rods 58a-c which are at least three in number and consist of knobs 60a-c, threaded shanks 62a-c, hollow sleeves 64a-c upset at the top end and threaded at the bottom, spring-pressure washers 66a-c, pressure springs 68a-c, threaded holes 70a-c for receiving the threaded areas of the sleeves 64a-c and locking screws 72a-c for fixing the said sleeves 64a-c, once screwing into the holes 70a-c has been completed. Finally, the threaded ends of the shanks 62a-c engage into threaded holes of the annular flange 56. The same flange 56 is provided with through-holes 76a-f receiving bolts 78a-f which engage into threaded holes 80a-f of two half counter-flanges 82a and 82b which, together with the flange 56, grip the thickened flange 48 attached to the neck 46 of the belljar 14. A compensating seal 84, kept gripped by the action of the bolts 78a-f in the threaded holes 80a-f, is inserted between the counter-flanges 82a and 82b.

The cap 52 is closed at the top by a flange 86 terminating in a closed upper dome-piece 88 having, mounted above it, a threaded sleeve 90 internally engaged by a threaded shank 92 which terminates in a raising knob 94. The said dome-piece 88 communicates with a sleeve 96 for connection to an external source of gas to be used inside the reaction chamber 10. The dome-piece 88 has an internal chamber 98 with a bottom 100 defining an annular slit which, together with a further annular slit 102, provides an angularly uniform supply to an annular chamber 104 defined between the flange 86 and the upper side of the cap 52, where the annular chamber 104 communicates with outlet pipes 106a-f (in this case six in number) emerging inside the belljar 14 above the plate 40. An O-ring gasket 108 ensures a seal between the flange 86 and the cap 52 when the flange 86 is pressed against the cap 52 by a set of bolts 110a-f shown in FIGS. 3 and 4. The outlet pipes 106a-f, which are made of chemically inert material, such as quartz or ceramic material, are connected to the bottom of the cap 52 by means of the threaded sleeves 112a-f which are screwed into corresponding threaded holes passing through the bottom of the said cap 52. The cap 52 is provided with an internal chamber 114 for a flow of cooling fluid, such as water, which enters into and emerges from connecting sleeves 116 and 118, respectively. A sleeve 120 for connection to a space defined between two gaskets engaged between the bottom of the cap 52 and the thickened flange 48 provides an indication as to the sealing efficiency of these gaskets.

Figure 1:
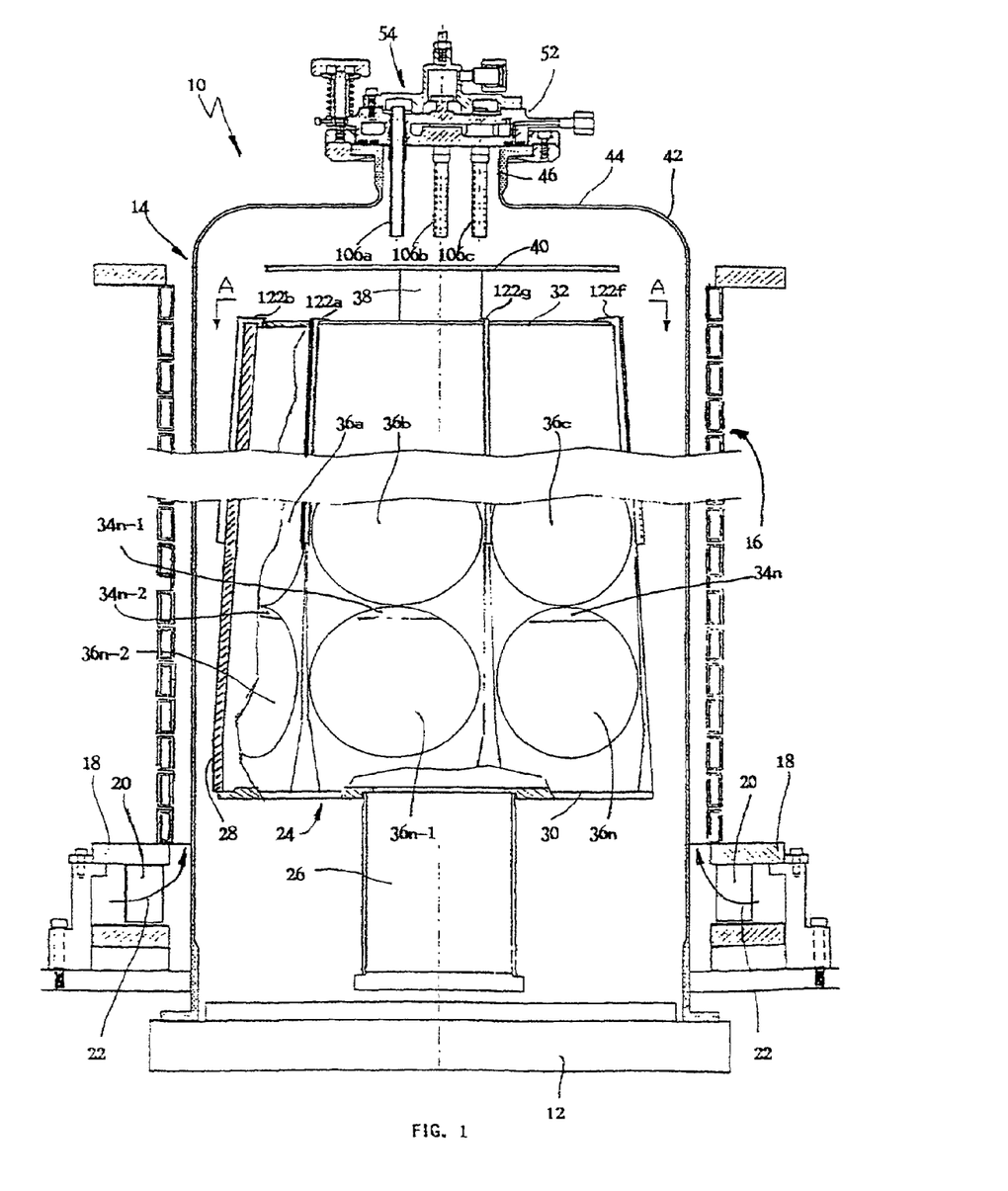
FIG. 1 shows a cross-sectional view of the reaction chamber of an epitaxial reactor according to the invention housing a susceptor of the type comprising two rings of seven columns each, i.e. intended for wafers with a diameter of 150 mm (6")
Figure 2:
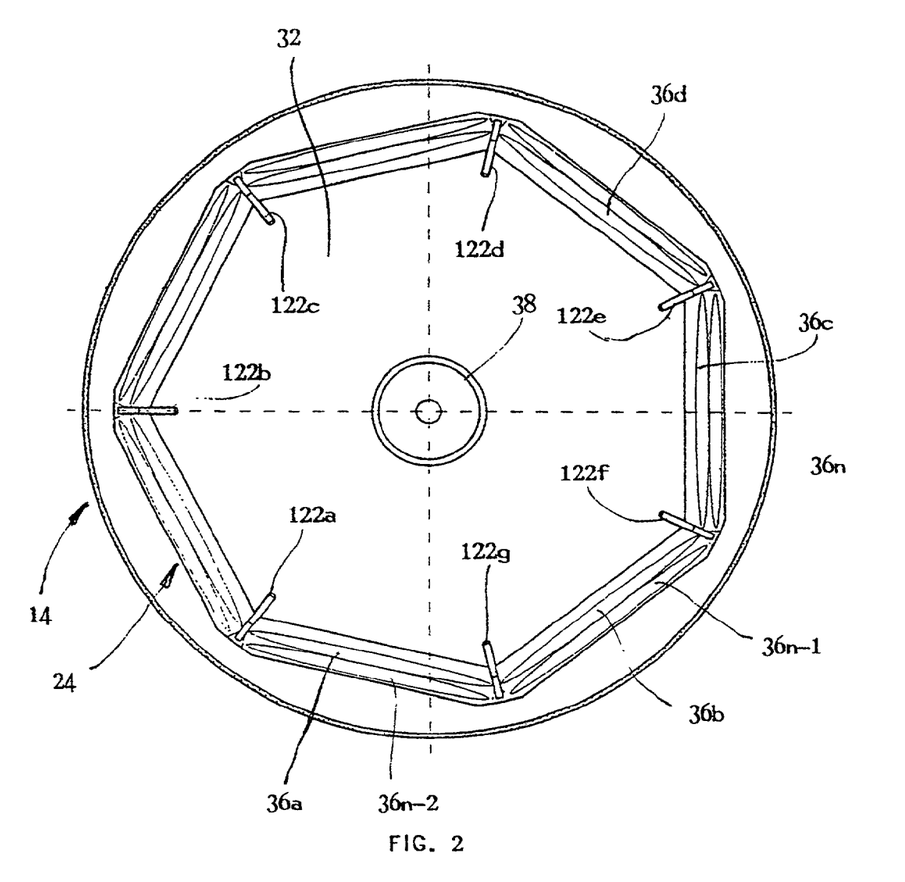
FIG. 2 is a sectioned plan view of the same reaction chamber along the line A-A shown in FIG. 1.

With reference again to FIGS. 1 and 2, it can be seen that the shell 28 and the upper flat plate 30 of the susceptor 24, in the region of the lateral corners, are provided with baffles 122a-g made of chemically inert material, such as glass, quartz, ceramic material or graphite lined with silicon carbide. Graphite is preferred since it may be easily and precisely machined and may be easily lined with silicon carbide, so that, once the desired dimensions have been achieved, the baffles 122a-g more or less require no further modification.

The silicon source gases emerge from the outlet pipes 106a-f of the distributor 54, are diffused above the inert plate 40 and then flow between the side wall of the belljar 14 and the shell 28 of the susceptor 24 where the pyrolysis reactions occur, resulting in epitaxial deposition of silicon onto the wafers 36a-n.

The results of using the reaction chamber according to the present invention are as follows:
1) the individual parts are no longer of a critical nature so that, when belljars, caps and pipes are changed, the performance is unaffected;
2) the uniformity of thickness of individual wafers within the same batch improves;
3) a typical "form" for distribution of the growth thickness is obtained inside each wafer.

In particular, owing to the results 1 and 3, it has been possible to concentrate efforts solely on variations in the growth thickness inside each wafer. In fact, distribution of the thickness in each wafer occurs as follows:
   in the case of a susceptor for wafers with a diameter of 125 mm (5"), having three rings of eight wafers each:
   in the first ring the wafers have a growth layer which is thinner on the right-hand and left-hand sides and thicker in the centre;
   in the second ring the wafers have a growth layer which is thinner on the right-hand and left-hand sides and only slightly higher in the centre;
   in the third ring the wafers have a completely uniform growth layer.

In the case of a susceptor for wafers with a diameter of 150 mm (6"), having two rings of seven wafers each:
   in the first ring the wafers have a growth layer which is thinner on the right-hand and left-hand sides and thicker in the centre;
   in the second ring the wafers have a growth layer which is completely uniform.

The task which must be performed here is to ensure, as far as possible, an identical distribution of the growth thickness in the individual rings.

It is known that, in the barrel-type reactor, the susceptor 24 is in the form of a truncated pyramid with a regular polygonal base, while the belljar 14 has a circular shape. Consequently, the flow channel for the gases between susceptor 24 and belljar 14 has a variable cross-section in a horizontal direction with a greater cross-section in the centre of the wafer (see FIG. 2 hereinbelow). Moreover, the same flow channel has a variable cross-section in the vertical direction also since the belljar 14 wall is perfectly vertical, while the side walls of the susceptor 24 are inclined by a few degrees (typically 3°) with respect to a vertical axis common to the belljar and the susceptor. This inclination results in an increase in the flow speed of the gases towards the bottom of the susceptor and the belljar, which is necessary in order to compensate for the gradual exhaustion in silicon in the mixture of hydrogen and silicon compounds which occurs as the gas flows down the susceptor. As already explained in Italian Patent No. 1,231,547 and in the corresponding published application of European Patent No. 0,415,191, a smaller cross-section corresponds, within certain limits, to a greater flow speed of the gases and therefore greater speed of silicon deposition. However, the situation is rendered more complex owing to the interaction between the boundary layers around susceptor and the belljar, where the interaction depends on the respective temperatures (it should be remembered that the susceptor 24 is heated by the currents induced by the coil 16, while the belljar is cooled by the air currents 22) and on the distance between the susceptor and internal belljar wall. For this reason, in the first ring of a susceptor for wafers with a diameter of 150 mm (6") and in the first and second rings for wafers with a diameter of 125 mm (5"), the distance between the boundary layers, and therefore the flow cross-section, is such as to produce a faster movement of the gases on the sides of the wafer than in the centre. On the other hand, in the bottom ring, the distance between the boundary layers, and therefore the flow cross-section, is such as to produce a movement of the gases with a uniform speed both on the sides and in the centre of the wafer. The problem has been solved by the measures described and claimed in the abovementioned Italian Patent No. 1,231,547 and in the corresponding published application of European Patent No. 0,415,191, the descriptions of which are regarded as incorporated herein for reference purposes. According to this solution, the corners of the susceptor have been provided with dividing baffles in order to modify the boundary layers of the upper ring without modifying the boundary layer of the bottom ring. However, as already mentioned in the preamble of the present description, if the measure proposed by this prior art was sufficient to ensure a fairly uniform distribution in the outflow speed of the gases, moving the boundary layers away from each other, it only produced successful results so long as components extraneous to the susceptor, such as the belljar, the cap and the gas distributor with a pair of parallel superimposed disks, were not replaced. As soon as one of these components was replaced, the results became extremely negative such that the above invention was considered to be of limited value. Only now, with the discovery relating to the influence of the height of the shoulder 42 of the belljar 14 relative to the plate 40 and modification of the distributor 54, carried out as shown in detail here in FIGS. 3 and 4, has it been possible to eliminate the drawbacks arising in the said prior art thereby resulting in the abovementioned invention becoming fully utilisable.

As mentioned hereinabove, the present invention has made the invention described in Italian Patent No. 1,231,547 fully utilisable, together with the additional advantage of using small-size dividing baffles 122*a-g* which are not permanent, i.e. are simply inserted into recesses of the corners present in the susceptor 24, but are not formed integrally in the susceptor 24. The reduction in the size of the baffles 122*a-g* has also had positive effects on control of the resistivity of the epitaxial layer, since these baffles, being effectively heat dissipators, could influence the performance parameters, such as the uniformity of resistivity, a parameter which is sensitive to temperature, in particular at points on the wafers adjacent to the baffles. Actually, with these said smaller-size baffles 122*a-g*, the uniformity of resistivity does not worsen, while, owing to the improvement in the uniformity of thickness in the vertical direction, i.e. between one ring and the next, it is possible to achieve with success a temperature profile for the susceptor able to optimise this uniformity, using, for example, regulating systems involving secondary induction devices, as described in Italian Patent No. 1,215,444 and in the corresponding European Patent No. 0,293,021.

The above description relates to a particular embodiment of the invention which is not to be regarded as limiting in any way, it being possible for persons skilled in the art to devise many similar and equivalent solutions, all of which are to be regarded as covered herein, as defined by the accompanying claims.

The invention claimed is:

1. An improved reaction chamber for an epitaxial reactor comprising a belljar having a shoulder and made of insulating and transparent material, a susceptor provided with disk-shaped cavities for receiving wafers of materials to be treated and having an insulating and chemically resistant flat plate arranged above it, comprising: a diffuser formed by a cap supplied by a central dome-piece connected to a symmetrical annular distribution chamber having a plurality of pipes of the same length which connect said annular chamber of the cap to a dome zone of the belljar situated just underneath a neck connecting an upper flange to the dome, said plurality of pipes ensuring a uniform distribution of flow at a lower speed; a cylindrical zone of the belljar extended above the flat plate supported above the susceptor so as to eliminate any interference between the flat plate and shoulder; a minimum internal diameter of the belljar for sufficiently spacing the belljar from the susceptor; and on the corners of the susceptor, in its upper zone, projecting baffles inserted into recesses formed in the body of the susceptor, said baffles extending longitudinally at half the height of the susceptor; wherein the cap of the diffuser is fixed to an annular flange which is in turn fixed to an upper thickened flange of the belljar by means of a pair of two half counter-flanges gripping the annular flange against the upper thickened flange of the belljar; and wherein the fixing of the cap of the diffuser to the annular flange is performed by means of a plurality of spring-loaded tie-rods which push in an elastic manner the cap against the annular flange.

2. The improved reaction chamber for an epitaxial reactor of claim 1 wherein the cap is closed at the top by a flange terminating in a dome-piece communicating with a sleeve for connection to an external source of gas to be used in the same reaction chamber, which dome-piece is provided with a bottom defining at least one circular slit for ensuring a rigorously uniform distribution of gas to an annular chamber for supplying the plurality of pipes emerging from the distributor inside the belljar.

3. The improved reaction chamber for an epitaxial reactor of claim 2 wherein in addition to the slit in the bottom, a further annular slit helps ensure the uniform distribution of gas to the annular chamber supplying the outlet pipes.

4. The improved reaction chamber for an epitaxial reactor of claim 2 wherein the cap of the distributor comprises an internal chamber for the flow of a cooling fluid.

5. The improved reaction chamber for an epitaxial reactor of claim 2, characterized in that the outlet pipes are made of a material which is chemically inert with respect to the gas used in the belljar.

6. The improved reaction chamber for an epitaxial reactor of claim 5 wherein the outlet pipes are made of glass.

7. The improved reaction chamber for an epitaxial reactor of claim 5 wherein the outlet pipes are made of ceramic material.

8. The improved reaction chamber for an epitaxial reactor of claim 5 wherein the outlet pipes are made of quartz.

9. The improved reaction chamber for an epitaxial reactor of claim 1 wherein the baffles fixed to the susceptor are made of material chemically inert with respect to the gases used in the chamber.

10. The improved reaction chamber for an epitaxial reactor of claim 9 wherein the baffles fixed to the susceptor are made of glass.

11. The improved reaction chamber for an epitaxial reactor of claim 9 wherein the baffles fixed to the susceptor are made of ceramic material.

12. The improved reaction chamber for an epitaxial reactor of claim 9 wherein the baffles fixed to the susceptor are made of quartz.

13. The improved reaction chamber for an epitaxial reactor of claim 9 wherein the baffles fixed to the susceptor are made of graphite lined with silicon carbide.

14. A reaction chamber for an epitaxial reactor comprising: a belljar; a susceptor inside the belljar; and a diffuser disposed on the top of the belljar; the belljar being made of insulating and transparent material and having an upper flange, the flange joined to a neck, a shoulder joined to a flat zone and a cylindrical zone joined to the shoulder; the susceptor comprising a body shaped like a truncated pyramid, the susceptor being provided with disk-shaped cavities for receiving wafers of material to be treated, and supporting an insulating and chemically resistant flat plate above it, the flat plate facing the flat zone of the belljar; the diffuser being formed by a cap supplied by a central dome-piece connected to a symmetrical annular distribution chamber having a plurality of pipes of the same length which connect the annular chamber of the cap to a dome zone of the belljar situated just underneath its neck, the plurality of pipes feeding gases into the belljar and ensuring a uniform distribution of gas flow at a lower speed; wherein the belljar is spaced from the susceptor; and wherein the flat plate is so arranged as to deflect gases coming from the plurality of pipes; wherein the cap of the diffuser is fixed to an annular flange which is in turn fixed to an upper thickened flange of the belljar by means of a pair of two half counter-flanges gripping the annular flange against the upper thickened flange of the belljar; wherein the fixing of the cap of the diffuser to the annular flange is performed by means of a plurality of spring-loaded tie-rods which push in an elastic manner the cap against the annular flange.

15. A reaction chamber for an epitaxial reactor comprising: a belljar; a susceptor inside the belljar; and a diffuser on the top of the belljar; the belljar being made of insulating and transparent material and having an upper flange, the flange joined to a neck, the neck joined to a flat zone, the flat zone joined to a shoulder, and the shoulder joined to a cylindrical zone; the susceptor comprising a body shaped like a truncated pyramid, the susceptor being provided with disk-shaped cavities for receiving wafers of material to be treated, and supporting an insulating an chemically resistant flat plate above it, the flat plate facing the flat zone of the belljar; the diffuser being formed by a cap supplied by a central dome-piece connected to a symmetrical annular distribution chamber having a plurality of pipes of the same length which connect the annular chamber of the cap to a dome of the belljar situated just underneath its neck, the plurality of pipes feeding gases into the belljar and ensuring a uniform distribution of gas flow at a lower speed; wherein the belljar is spaced from the susceptor; and wherein the flat plate is arranged to deflect gases coming from a vertical direction from the plurality of pipes and to guide the gases into a horizontal direction between the flat plate and the flat zone until the end of the flat plate where the gases flow vertically downward to the susceptor for improved deposition; wherein a plurality of baffles are fixed to the susceptor and the baffles are made of material chemically inert with respect to the gases used in the chamber; wherein the cap of the diffuser is fixed to an annular flange which is in turn fixed to an upper thickened flange of the belljar by means of a pair of two half counter-flanges gripping the annular flange against the upper thickened flange of the belljar; and wherein the fixing of the cap of the diffuser to the annular flange is performed by means of a plurality of spring-loaded tie-rods which push in an elastic manner the cap against the annular flange.

16. The improved reaction chamber for an epitaxial reactor of claim 15 wherein the baffles fixed to the susceptor are made of glass.

17. The improved reaction chamber for an epitaxial reactor of claim 15 wherein the baffles fixed to the susceptor are made of ceramic material.

18. The improved reaction chamber for an epitaxial reactor of claim 15 wherein the baffles fixed to the susceptor are made of quartz.

19. The improved reaction chamber for an epitaxial reactor of claim 15 wherein the baffles fixed to the susceptor are made of graphite lined with silicon carbide.

* * * * *